(12) United States Patent
Nielsen et al.

(10) Patent No.: US 8,345,428 B2
(45) Date of Patent: Jan. 1, 2013

(54) DATA ACQUISITION MODULE AND SYSTEM

(75) Inventors: Carl Nielsen, Lyngby (DK); Lars Kroman, Birkerød (DK); Aage Vastrup, Kokkedal (DK); Halge Larsen, Kokkedal (DK); Carsten Hansen, Tung Chung (HK); Lars Thestrup, Nærum (DK)

(73) Assignee: Brüel & Kjær Sound & Vibration Measurement A/S, Nærum (DK)

( * ) Notice: Subject to any disclaimer, the term of this patent is extended or adjusted under 35 U.S.C. 154(b) by 804 days.

(21) Appl. No.: 12/119,690

(22) Filed: May 13, 2008

(65) Prior Publication Data

US 2009/0284934 A1 Nov. 19, 2009

(51) Int. Cl.
*H05K 7/00* (2006.01)
*G06F 15/16* (2006.01)

(52) U.S. Cl. ........................ 361/729; 709/250
(58) Field of Classification Search .................. 709/250; 361/91.5, 98, 679.4, 679.31, 684, 729
See application file for complete search history.

(56) References Cited

U.S. PATENT DOCUMENTS

| | | | | |
|---|---|---|---|---|
| 4,956,561 | A * | 9/1990 | Tamer | 307/10.1 |
| 5,411,405 | A * | 5/1995 | McDaniels et al. | 439/131 |
| 5,861,873 | A * | 1/1999 | Kikinis | 345/157 |
| 6,144,561 | A * | 11/2000 | Cannella et al. | 361/796 |
| 6,321,340 | B1 * | 11/2001 | Shin et al. | 713/310 |
| 6,551,111 | B1 * | 4/2003 | Watanabe | 439/11 |
| 6,583,989 | B1 * | 6/2003 | Guyer et al. | 361/724 |

(Continued)

FOREIGN PATENT DOCUMENTS

JP 6-253053 9/1994

OTHER PUBLICATIONS

European Examination Report for European Patent Application No. 09 746 243.6, May 31, 2011, European Patent Office, Munich, Germany.

(Continued)

*Primary Examiner* — Lisa Lea Edmonds
*Assistant Examiner* — Xanthia C Cunningham
(74) *Attorney, Agent, or Firm* — Stites & Harbison PLLC; Marvin Petry

(57) ABSTRACT

The present invention relates to units or modules for data acquisition that may either be used as stand alone units or be used to form a modular system where a plurality of modules are mounted together in a frame or rack structure as well as combinations of such stand-alone units and frames. More specifically the invention relates to a module for data acquisition comprising a detachable front unit (3) for releasable attachment to said module (1) comprising one or more first electrical connector means (4) for receiving data or signals from external units, such as microphones and/or accelerometers, and/or for providing data or signals, such as control signals, to external units; a main body comprising means (6) of establishing electrical connection to said one or more connector means (4) in said front unit (3), when said front unit (3) is connected to said module (1); and where the main body being furthermore provided with data output connector means (10); whereby data or signals provided to the module (1) via said one or more first electrical connector means (4), or processed versions of such signals or data, can be provided from said module (1) to one or more external units, such as a PC, via said data output connector means (10).

14 Claims, 13 Drawing Sheets

U.S. PATENT DOCUMENTS

| | | | | |
|---|---|---|---|---|
| 6,594,131 | B2* | 7/2003 | Umekawa | 361/93.7 |
| 6,608,566 | B1 | 8/2003 | Davis | |
| 6,614,652 | B2* | 9/2003 | White et al. | 361/679.32 |
| 6,643,125 | B2* | 11/2003 | Nabetani et al. | 361/679.32 |
| 6,644,548 | B1* | 11/2003 | Lin et al. | 235/451 |
| 6,726,509 | B2* | 4/2004 | Milan | 439/752.5 |
| 6,733,332 | B1* | 5/2004 | Espenshade et al. | 439/541.5 |
| 6,742,069 | B2* | 5/2004 | Papa et al. | 710/302 |
| 6,767,253 | B1* | 7/2004 | Werner et al. | 439/638 |
| 6,776,345 | B1* | 8/2004 | Liang | 235/486 |
| 6,795,318 | B2* | 9/2004 | Haas et al. | 361/729 |
| 7,012,815 | B2* | 3/2006 | Garnett et al. | 361/825 |
| 7,065,600 | B2* | 6/2006 | Papa et al. | 710/302 |
| 7,202,641 | B2 | 4/2007 | Claessens et al. | |
| 7,259,950 | B2* | 8/2007 | Chen | 361/93.1 |
| 7,373,356 | B2* | 5/2008 | Potter et al. | 369/30.01 |
| 2004/0034658 | A1* | 2/2004 | Potter et al. | 707/104.1 |
| 2004/0062002 | A1* | 4/2004 | Barringer et al. | 361/687 |
| 2005/0114044 | A1* | 5/2005 | Hala et al. | 702/33 |
| 2007/0035915 | A1* | 2/2007 | Chen et al. | 361/679 |
| 2007/0064385 | A1* | 3/2007 | Paul et al. | 361/687 |
| 2008/0089020 | A1* | 4/2008 | Hiew et al. | 361/684 |
| 2008/0239657 | A1* | 10/2008 | Oyama et al. | 361/685 |

OTHER PUBLICATIONS

Brüel & Kjaer: "IDA Hardware configurations for PULSE Version 9.0—Types 3560B, C, D, E", System Data, Sep. 2, 2004, XP002536537.

Braun C G: "Transforming the way we teach laboratories: a student data acquisition system", Frontiers in Education Conference, 1996. FIE '96. 26th Annual Conference., Proceedings of Salt Lake City, UT, USA Nov. 6-9, 1996, New York, NY, USA, IEEE, US, vol. 2, Nov. 6, 1996, pp. 633-636, XP010210010, ISBN: 978-0-7803-3348-2.

Simatic Net: "AS-Interface—Einfuhrung and Grundlagen", Handbuch Siemens, Nürnberg, Germany, [Online] vol. C79000-G8900-C089-04, Apr. 1, 2006, pp. 1-63, XP002516220.

First Office Action for Chinese Application No. 200980117342.9, Sep. 26, 2011, State Intellectual Property Office of the People's Republic of China, Beijing, China.

Second Office Action for Chinese Application No. 200980117342.9, May 3, 2012, State Intellectual Property Office of the People's Republic of China, Beijing, China.

Office Action for Japanese Application No. 2001-509069, Jun. 19, 2012, Japanese Patent Office.

* cited by examiner

DATA ACQUISITION MODULE AND SYSTEM

TECHNICAL FIELD

The present invention relates generally to units or modules for data acquisition that may either be used as stand-alone units or be used to form a modular system where a plurality of modules are mounted together in a frame or rack structure. The present invention relates more specifically to input and/or output means for providing communication with external units, such as transducers, various kinds of signal processing equipment or analysers and/or computers and to output means facilitating communication with external receptor equipment, such as a PC, via a standard LAN connection.

BACKGROUND OF THE INVENTION

Data acquisition equipment is generally well known within the art for instance for collecting, registering and processing signals from microphones or accelerometers used to monitor the acoustical environment in for instance airports or inside the cabin of an airplane, train or automobile or for connecting a number of transducers, such as microphones or accelerometers distributed over an industrial installation. Also for accessing sound quality in enclosed spaces, such as automobile cabins, such units or systems are used to couple an often vast number of transducers to suitable recording and/or analysing equipment. Prior art Data Acquisition systems are thus both used for development tasks during test or verification and for monitoring purposes in existing installations.

A problem with known data acquisition modules and systems is that such modules are provided with a fixed connector configuration for connecting the module to various transducers and/or for providing control signals to external equipment. If for some reason a user should want to change his transducer set-up or have access to other or another number of control signals, it will thus be necessary to use another module with another connector configuration. Thus, a number of different modules might be necessary in order to carry out different tasks, which is not an optimal solution. As will become apparent, this problem is one of the problems actually addressed and solved by the present invention as set forth in the subsequent summary of the invention and in connection with the different embodiments of the invention described below.

In prior art data modular data acquisition systems, direct data communication between the module and external receptor equipment, for instance a personal computer (PC) is not possible. In many instances it would be advantageous to have access to data acquisition modules from which data can be directly and without any additional means communicated to for instance a PC for analysis, storage or processing. Also it would be advantageous if control signals etc. can be directly communicated from said external equipment to the module. This direct data communication should preferably be accomplished via a standard LAN cable as used extensively in connection with personal computers etc. Also this issue is addressed and solved by the present invention as set forth in the subsequent summary of the invention and in connection with the different embodiments of the invention described below.

Furthermore, it would be advantageous to have access to data acquisition modules that can be used either as completely self-contained stand-alone units that can communicate with for instance a PC via said standard communication means, such as a LAN cable, or together with other modules, either in the form of individual stand-alone modules, for instance located at different places in an installation or in the form of a frame or rack, accommodating a number of such modules. Also this issue is addressed and solved by the present invention as set forth in the subsequent summary of the invention and in connection with the different embodiments of the invention described below.

A problem with prior art data acquisition modules or units is that they function either as stationary or portable units and that set-ups based on prior art modules often require application of a vast number of cables. With prior art modules it is also difficult to form distributed data acquisition systems and such modules or units have often limited and predefined options for battery operation. It would furthermore be advantageous for a user to have a clear visual indication of the connector configuration on the module in order to reduce the risk of erroneous set-up of a (new or altered) measurement system.

All of the above and further issues and problems are addressed and solved by the modules and systems of modules according to the present invention.

SUMMARY OF THE INVENTION

On the above background it is an object of the present invention to provide a module for data acquisition that can be used as a separate unit for acquisition of data provided by external units such as microphones, accelerometers, strain-gauges, bridge-interfaces or any other electrical transducers, carrying out optional processing of such data and providing said acquired data, or processed versions hereof, to external receptor units, such as computers, analysers, storage means, etc. Furthermore, according to the invention, either one or more of said modules can be mounted together in a frame or rack making it possible for said one or more modules to communicate with each other and/or utilise support functions, such as a power supply, cooling, firmware update or common control functions provided in said frame or rack. The frame provides a compact multi-channel solution.

The modules according to the present invention are characterised by a number of important features. Thus, the modules are according to the invention provided with a detachable front unit or plate comprising a number of electrical input connector means for connection to said external units, such as microphones or accelerometers. Said input connector means could for instance be BNT connectors or other standardised connector types, or even connectors designed with a specific application in mind. The detachable front unit or panel can for instance comprise six BNC or microphone connectors or a combined 25-pin multi-pole connector with all electrical connections in a single connector. Any type and combination of connectors can be provided on the front unit or panel in the module according to the invention.

Said front unit or panel is according to the invention designed for releasable attachment to a corresponding front portion of the module, for instance by providing the front portion of the module with a recessed portion into which the front unit or plate can fit. Between the input connector means of the front unit or plate and the module there is provided electrical connection via electrical terminals provided on appropriate surface portions of the front unit or plate and corresponding surface portions of the module. A specific embodiment of a detachable front unit according to the invention will be described in the following detailed description of the invention together with a number of advantageous features of the front unit or plate.

The modules according to the invention are furthermore characterised by being provided with output connector means for establishing data/signal communication with external receptor equipment, such as computers, analysers, storage means, etc. According to an advantageous embodiment of the modules of the invention, said output connector means is a LAN connector facilitating direct access to many types of external units, such as personal computers.

The front panel can be used in different configurations. According to the invention, the actual function of a connector can be indicated by using different colours, for instance: Input connectors indicated by a green colour, output connectors indicated by a blue colour. In case of an error state occurring on a specific connector (overload etc.), this error state can be indicated by for instance a red colour. The specific configuration of input, output and error connectors on the front unit or plate can according to the invention be indicated using a light-emitting diode (LED) arrangement adjacent the individual connectors on the front unit or plate, with the LED arrangement being controlled from storage means in the front unit containing information about the configuration of the input connectors on that particular front unit.

Although the modules according to the invention can be used as stand-alone modules, for instance for data acquisition, where the individual modules can communicate with external equipment, such as recording equipment, signal analysers, digital signal processing systems or a PC host via a LAN (Ethernet) communication connector and appropriate cable, a number of individual modules according to the invention can also be mounted in a frame structure to provide a system of modules, for instance for multi-channel data acquisition purposes. By combining a number of modules in a frame or rack, the modules may draw on common resources, such as power supply means, common control means, etc. According to a presently preferred embodiment of the invention, the individual modules are provided with output connector means comprising a LAN female connector. When the modules are used as stand-alone modules a standard computer cable provided with a male LAN connector can be plugged into the LAN female output connector on the individual modules.

The present invention also comprises a system of modules for instance for data acquisition comprising a frame structure or rack for mounting one or more of the modules according to the invention and according to a presently preferred embodiment of the invention, the frame or rack is provided with fixed LAN male connectors corresponding to each of the individual modules that are mounted in the frame structure or rack. A specific embodiment of a frame structure or rack according to the invention is described in detail in the detailed description of the invention.

Several important advantages are attained with the modules or system of modules according to the present invention. Thus, the ability to use any module of the invention either in a frame or as a stand-alone module means that it becomes easy to provide a distributed system where the modules can be placed close to the measurement object. A precision time protocol (PTP) makes it possible to synchronise the clocks in the system components with sub-microsecond accuracy. With PoE (Power over Ethernet) via standard LAN cables, the only thing that is needed between modules and a PC are LAN cables and a PoE switch. This minimises the number of cables required in a given setup and results in lower cost, less downtime, easier maintenance and greater flexibility and speed of installation.

Furthermore, incorporating the detachable front unit as a part of each specific transducer system (and for instance designating the specific front unit used in that system in a clearly recognisable manner, such as by a specific colour) will lead to reduced risk of configuration errors when changing from one specific transducer setup (for instance for performing measurements of sound pressure levels generated by a loudspeaker system in the cabin of an automobile) to another transducer setup (for instance for measuring noise emission (by means of microphones) and vibration (by means of accelerometers) at the engine of the automobile.

BRIEF DESCRIPTION OF THE DRAWINGS

The invention will be better understood by considering the following detailed description of embodiments of the invention in conjunction with the figures of the drawing, where.

DETAILED DESCRIPTION OF THE INVENTION

The following detailed description of the invention comprises a specific embodiment of a module according to the invention and a specific embodiment of a frame structure or rack according to the invention that can accommodate one or more of the modules according to the invention, whereby these modules can share common functions and where for instance one of the modules can attain a role of controlling the other modules provided in the frame structure. The frame structure saves space and minimises the number of boxes in the solution. No external switch or power supplies are required and also fewer LAN cables are required as in connection with free-standing, separate modules. Furthermore, there is shown a number of measurement set-ups that can be obtained with the modules and/or frame structures according to the invention and these set-ups also form a part of the present invention. It is understood that the shown and described embodiments are only illustrative and that a person skilled in the art may conceive other embodiment of the modules, frame structures and systems of the invention without thereby departing from the scope of the present invention.

Figure 1:
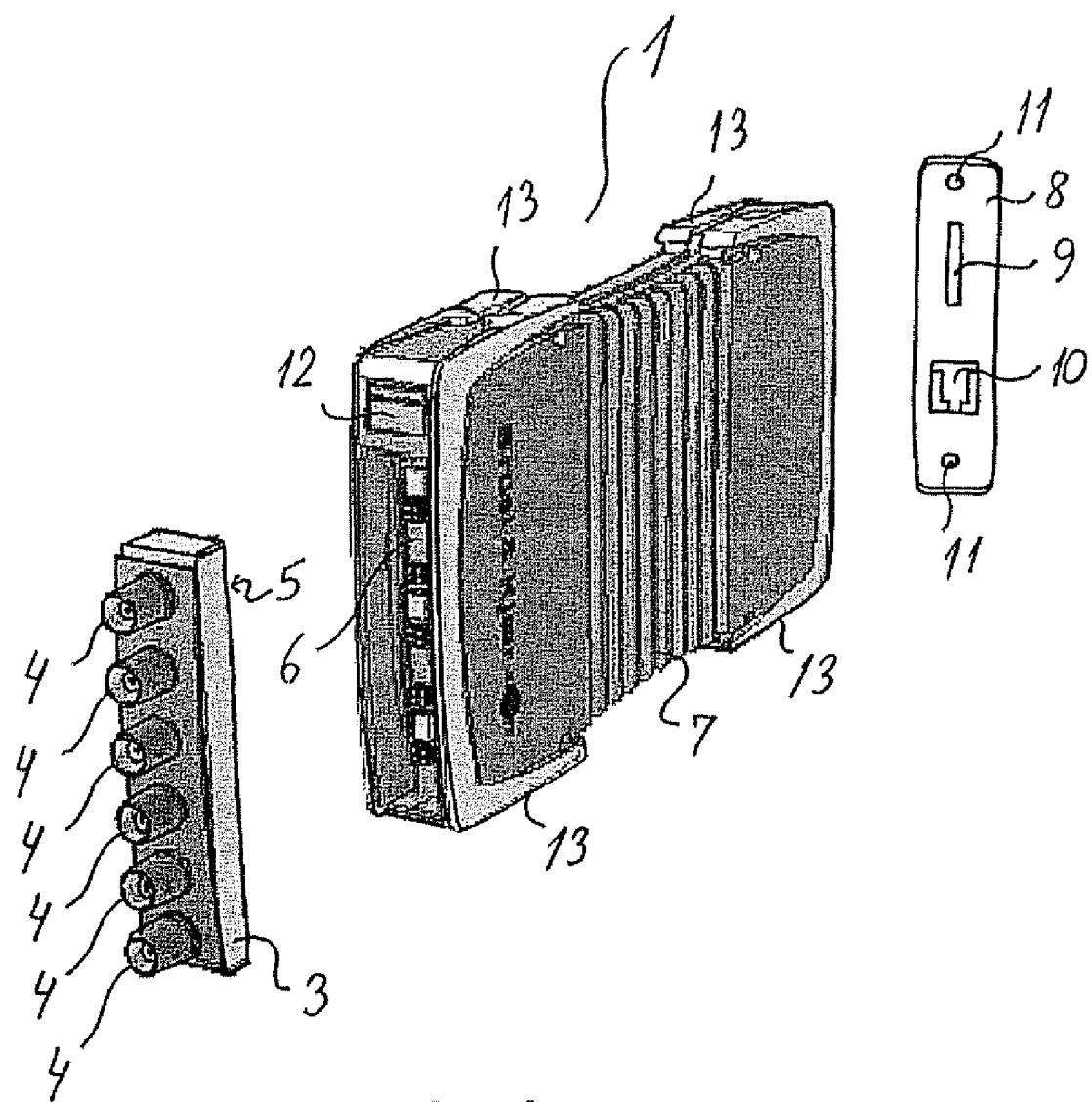
FIG. 1 shows a module for data acquisition according to an embodiment of the invention with the front unit detached from the main body of the module.

With reference to FIG. 1 there is shown an embodiment of a module for data acquisition according to the invention. The module according to the shown embodiment comprises a main body 1 at one longitudinal end portion provided with a recess 2 designed for accommodating a detachable front unit 3. The front unit 3 comprises a first set (six in the shown embodiment) of electrical connector means 4, for instance six BNC- or microphone connectors. Other connector types and/or numbers of connectors can of course also be chosen, such as a combined 25-pin multipole connector with all connections in one connector. Any types and numbers of connectors can be chosen according to the specific needs. The front unit 3 is furthermore provided with electrical terminal means 5 (not visible in FIG. 1) to establish electrical connection with corresponding terminals 6 provided in the accommodating recess 2. Although these corresponding terminal means in the shown embodiment are provided on the face of the front unit opposite the input connectors 4 and the corresponding terminals in the main body of the module are provided at the inner face of the recess, other placements of terminals on the front unit 3 and on the main body could be chosen if desired.

A portion of the outer surface of the module is formed as a heat sink 7 to cool the electrical components within the module. Also, the module may be provided with stands for instance in form of rubber feet 13 allowing the module to stand on a supporting surface for instance during operation.

On the rear face 8 of the module—opposite the recess 2—there is provided a second set of connector means. The connector means on the rear face of the module according to this embodiment of the invention comprise a female connector 9 for communication with a corresponding male connector provided in a frame structure that will be described in detail below. The module furthermore comprises a data output connector provided as a female LAN connector 10, into which for instance a standard LAN cable with a corresponding male LAN connector can be plugged for providing communication with external equipment, such as a personal computer (PC). The module is provided with guide means 11 for alignment with a frame or rack that will be described subsequently. Power supply can take place either via the connector 9 or via the LAN connector 10 in case a POE (power over Ethernet) facility is used.

As described above, the module according to the invention can be used as a fully operable stand-alone unit for instance for data acquisition. The main functional blocks of this embodiment of the module will be described below in connection with FIG. 10. According to this embodiment of the invention, all data communication takes place via the LAN connector 10.

Figure 2:
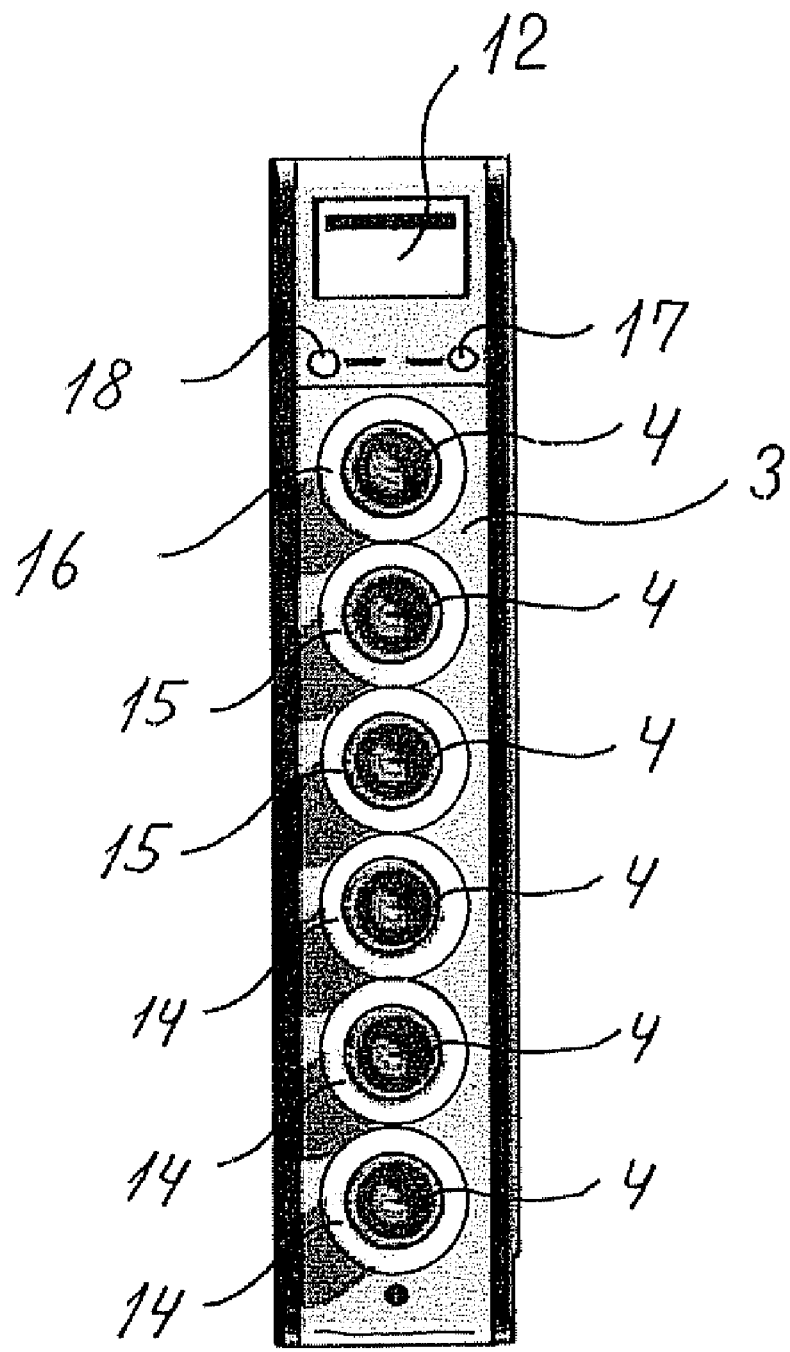
FIG. 2 shows the front face of the front unit provided with a number of connectors, the configuration (input/output) of which is indicated by means of LED arrangements of different colour.

Referring to FIG. 2 there is shown the front face of the front unit 3 provided with a first set of connectors 4, in this case comprising six connectors. The specific configuration of connectors (i.e. whether a given connector functions as an input or output connector) is according to this embodiment of the invention indicated by means of LED arrangements of different colour. According to the specific embodiment shown in FIG. 2, these LED arrangements consist of circles 14, 15, 16 surrounding each specific connector 4. Three of these 14 could for instance be indicated by a green circle indication that they function as input connectors, for instance for receiving data from microphones or accelerometers, two of the connectors 15 could be indicated by blue circles indicating that they function as output connectors, for instance for providing control data to various parts of a measurement setup, and one 16 could be indicated by a red circle indicating an error state on that particular connector. The front face of the module is furthermore provided with a small display 12 for indication of the status to the user, a switch 17 to control the small display 12 and an overall status indicator LED 18.

Figure 3:
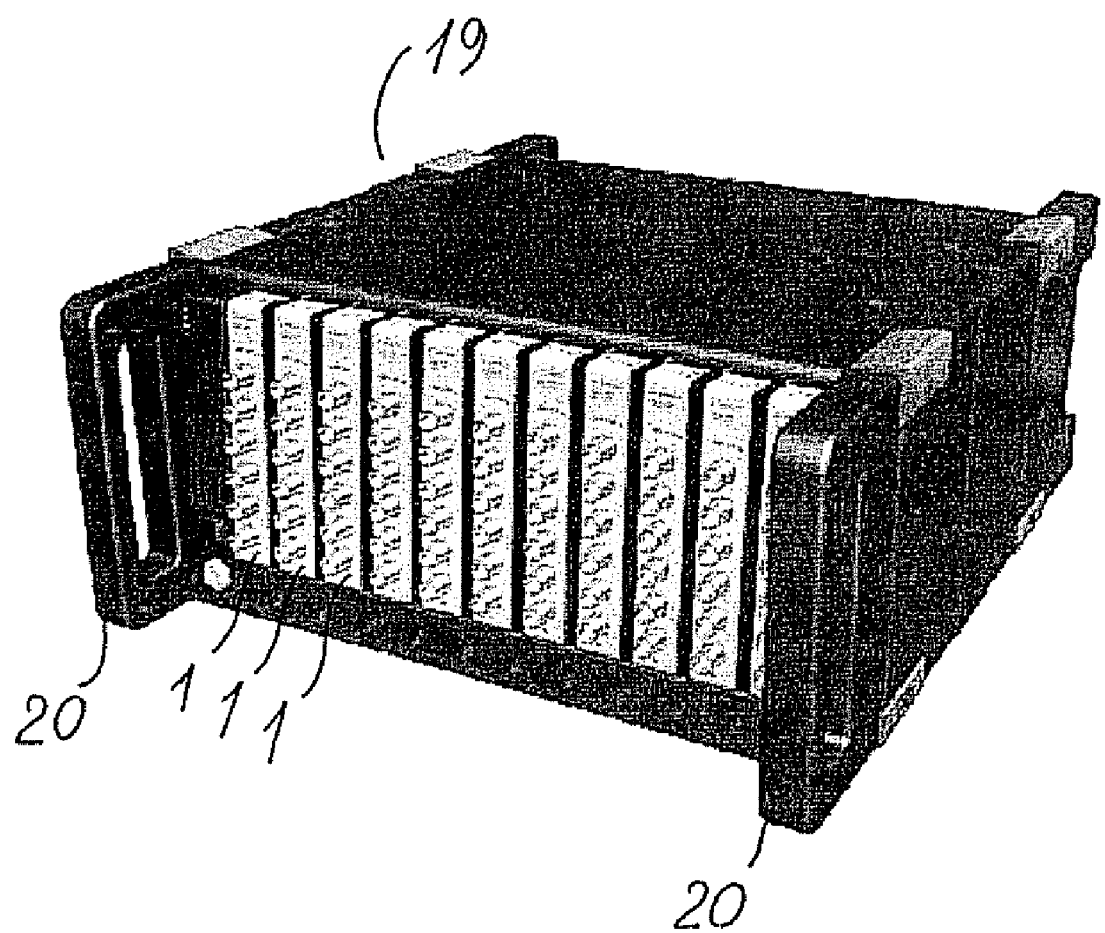
FIG. 3 shows a number of modules according to the embodiment of the invention shown in FIG. 1 mounted in a frame structure according to the invention.

Referring to FIG. 3 there is shown a number of modules 1 according to an embodiment of the invention mounted in a frame structure according to the invention generally designated by reference numeral 19. This frame structure or rack can be made very rugged, such that it can be used in any required environment and can furthermore be provided with handles 20 for easy transportation. In the shown embodiment of the frame structure, a total of eleven modules 1 are accommodated, but it is understood that also other numbers of modules may be used, if required. The frame structure 19 with data acquisition modules 1 is a complete stand-alone acquisition unit based on LAN (Ethernet) communication with a PC host. This acquisition system can according to the invention be expanded by using several frame structures connected by LAN switches and cables. Every new frame added to the LAN network will add x (in the shown case 11) new module slots to the system. If it is needed to add only one data acquisition module, the module is simply removed from the frame and connected to any LAN-cable in the acquisition network without any frame or adapter. Unlike other LAN-based systems, the concept of the present invention does not need a system frame and/or a system controller.

Figure 4:
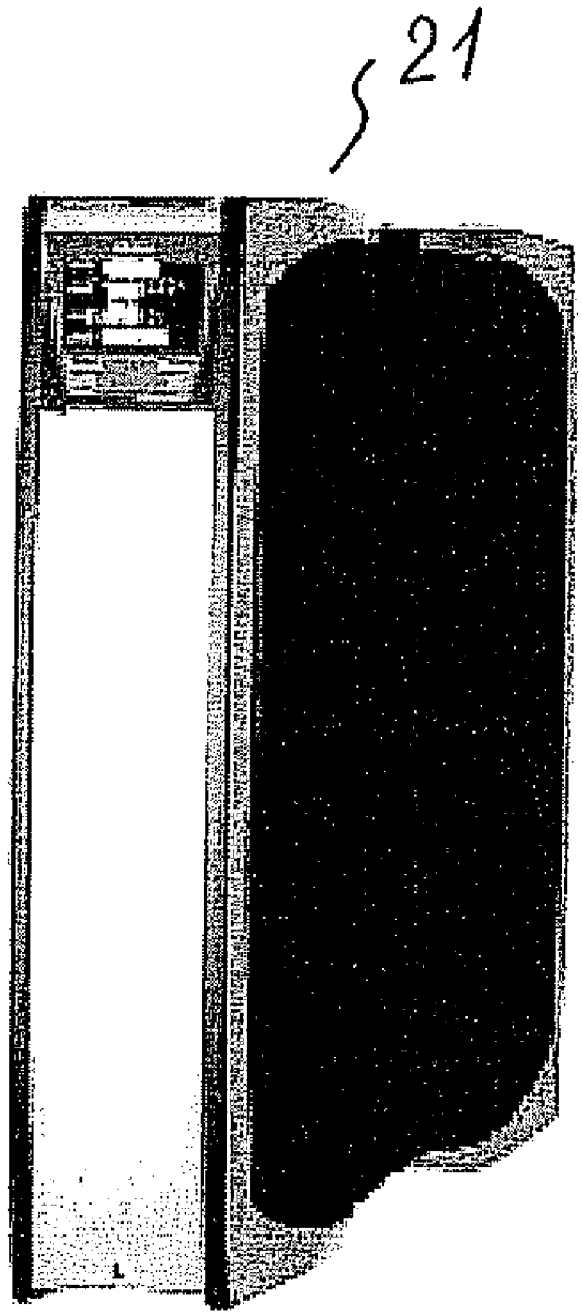
FIG. 4 shows an embodiment of a battery module according to the invention.

According to the invention, a dedicated battery module may be inserted in the frame structure for powering the modules in the frame. FIG. 4 shows an embodiment of a battery module 21 according to the invention. The frame structure according to the invention makes is possible to replace one or several data acquisition modules by Battery Modules to provide power-back-up or stand-alone battery-operated functionality.

Figure 5:
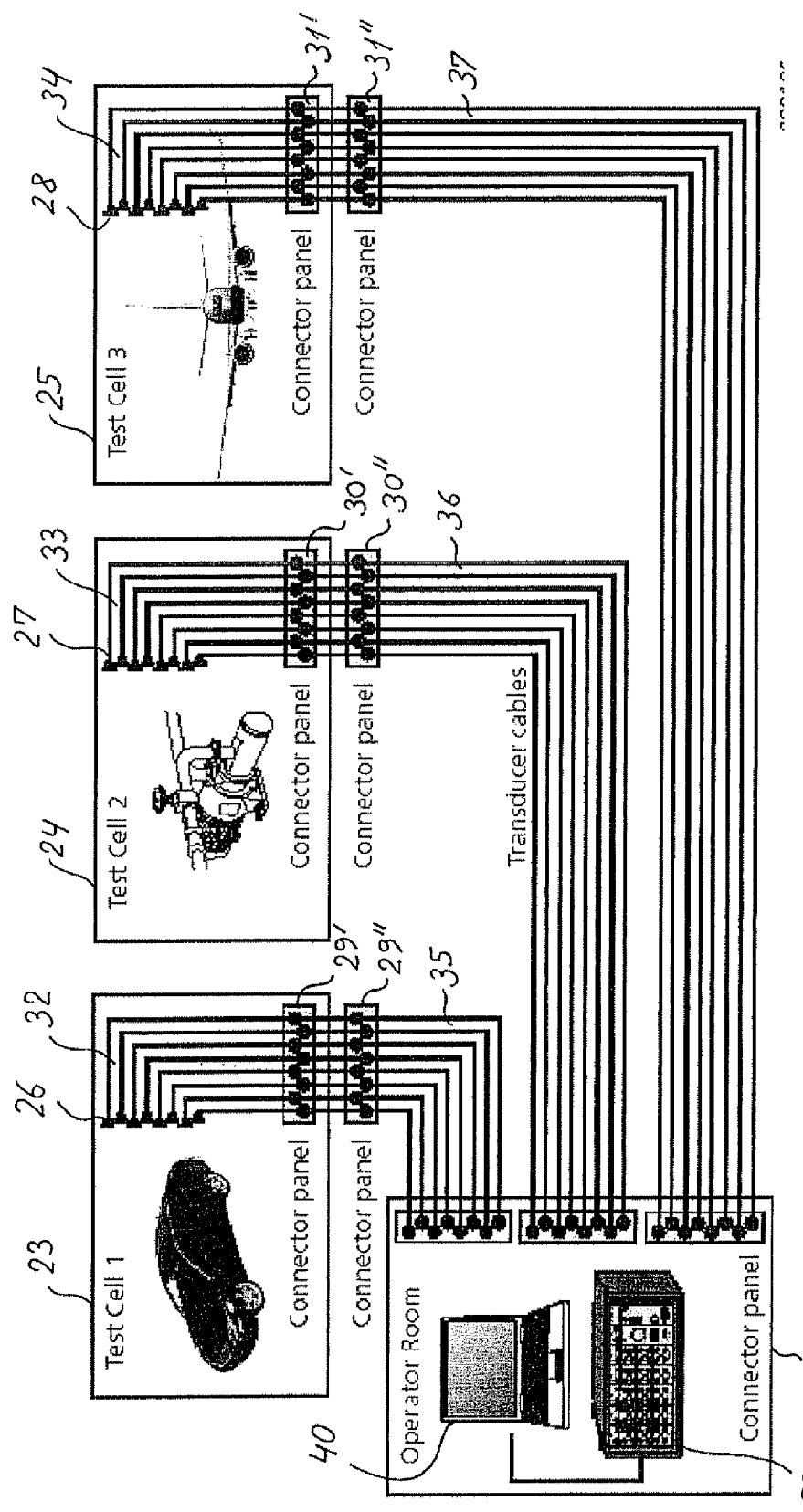
FIG. 5 shows a prior art measurement set-up requiring extensive transducer cabling.

The following relates to the use of modules and frames comprising such modules in typical measurement situations. Thus, FIG. 5 shows a prior art measurement setup requiring extensive transducer cabling. The setup comprises three test cells 23 (measurement of acoustic emission from an automobile), cell 24 (measurement or monitoring of acoustic emission from a component in an installation) and cell 25 (measurement of acoustic emission from an aircraft). In each cell, an array of microphones, 26, 27 and 28, respectively, are used to pick up acoustic emission. The individual microphone cables 32, 33 and 34 are connected to connector panels 29', 30', 31' in the specific cell, passed through the boundary of the cell to a corresponding panel 29'', 30'' and 31'' outside the cell and from these latter panels through transducer cables 35, 36, 37—that can be of considerable length—to an operator room 38 comprising prior art data acquisition equipment 39 and a PC 40. The extensive length of the transducer cables can cause severe problems for instance with respect to signal to noise ratio. Also, the total setup is quite complicated due to the many transducer cables and prone to errors for instance during setup or reconfiguration of the setup.

Figure 6:
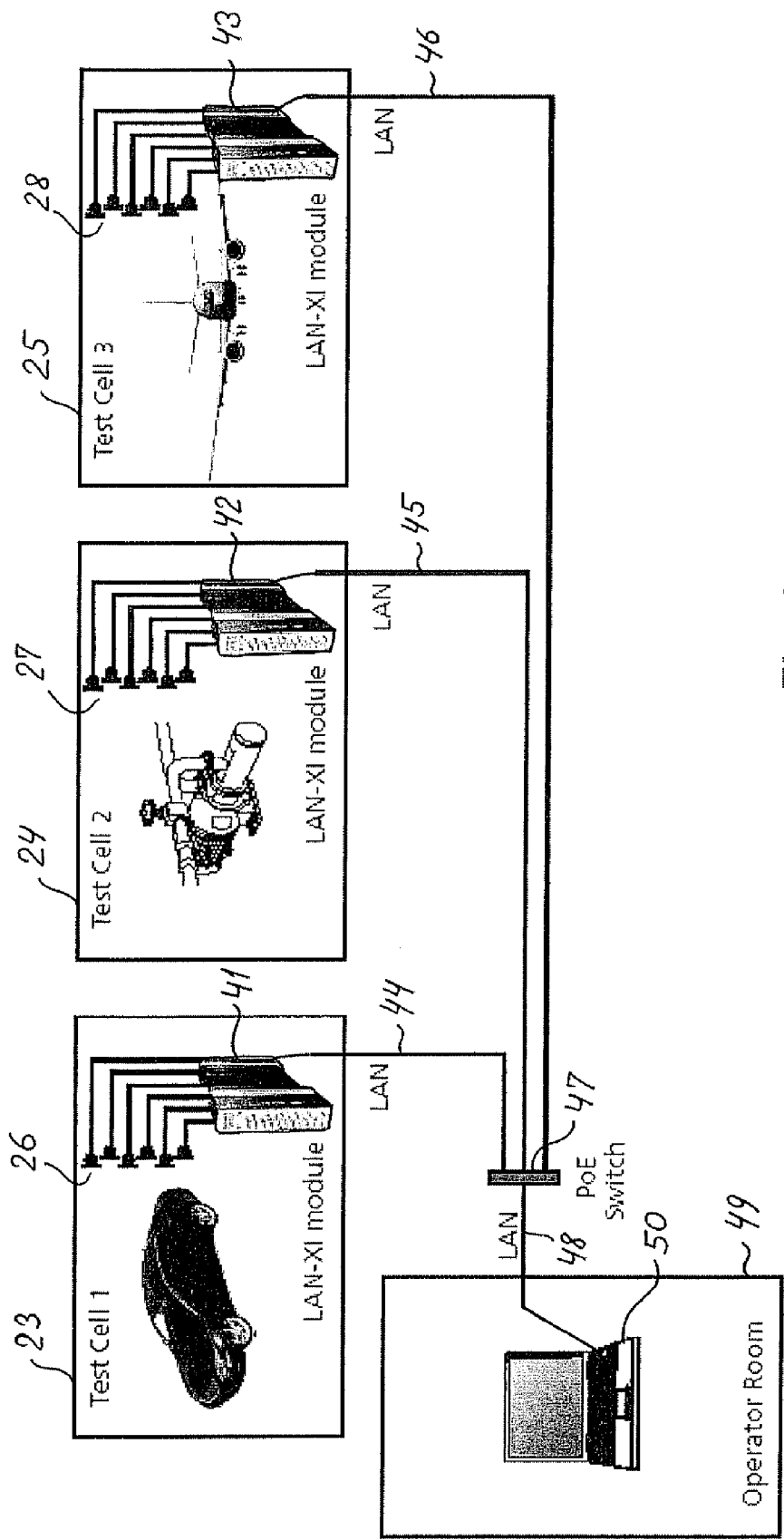
FIG. 6 shows a measurement set-up according to the present invention corresponding to the prior art set-up shown in FIG. 5.

FIG. 6 shows a measurement setup according to the present invention corresponding to the prior art set-up shown in FIG. 5. The setup shown in FIG. 6 constitutes a distributed data acquisition system comprising a single module according to the invention 41, 42, 43, respectively, in each of the test cells 23, 24, 25. The microphone arrays 26, 27 and 28, respectively, are connected via transducer cables—that can be made relatively short—to each of the respective modules 41, 42 and 43.

Acquired data are output from the rear LAN connector 10 on each of the modules through LAN cables 44, 45 and 46, respectively, and passed to an Ethernet switch 47 with power over Ethernet functionality, from which hence also the modules can be supplied with power. A common LAN connection 48 connects the switch 47 with a PC 50 running appropriate data analysis software and comprising data storage facilities located in the operator room 49. It is immediately apparent that the overall setup is much simpler than the prior art setup shown in FIG. 5. It might even be possible to replace the wired connections 44, 45, 46 by wireless, using wireless Ethernet bridges, provided the switch 47 can be located relatively close to each of the modules 41, 42, 43.

Figure 7:
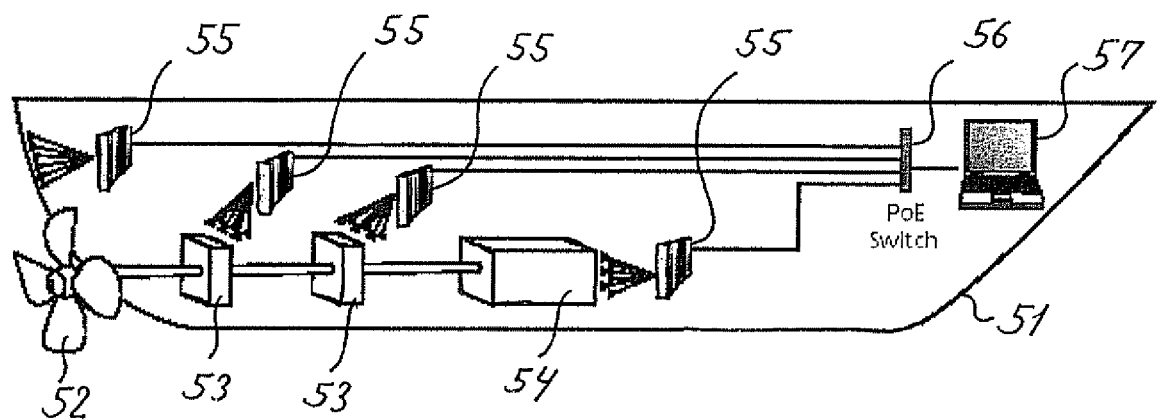
FIG. 7 shows a distributed measurement system according to the invention with modules situated close to the respective measurement object.

A further example of a distributed measurement system according to the invention with modules situated close to respective measurement objects is shown in FIG. 7. Individual modules 55 according to the invention are distributed over the structure of a ship 51, i.e. in the region of the propeller 52, in the vicinity of axle bearings 53 and at the engine 54. Output data provided from each module via the LAN output connector in the module are passed to a PoE switch 56 and from this to a PC 57, where analysis and/or storage of data from the modules can be carried out.

Figure 8:
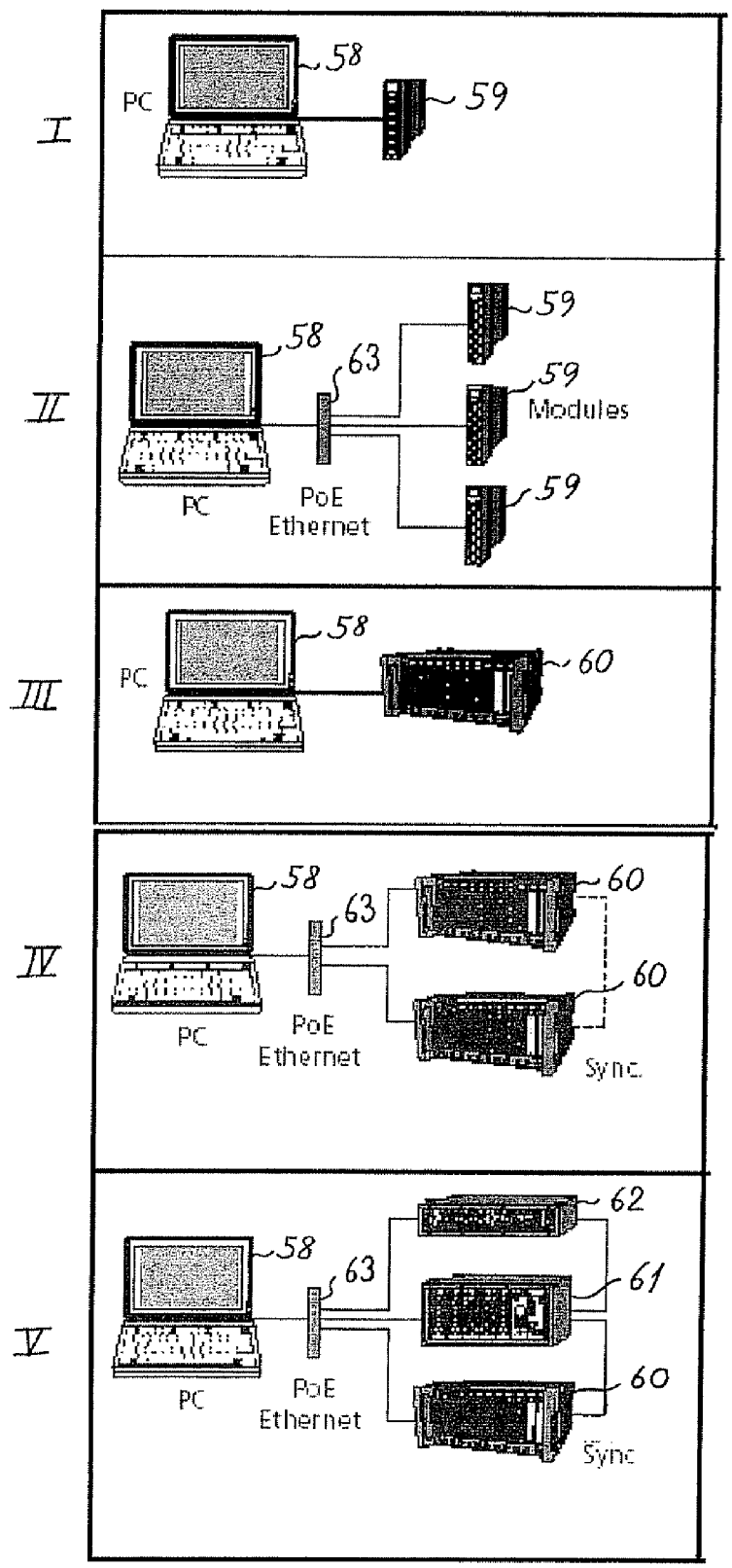
FIG. 8 shows as a non-limiting example a number of different measurement set-ups according to the invention ranging from a single module system to systems comprising several modules and/or frames of modules.

Referring to FIG. 8 there is shown five different measurement setups according to the invention, designated by I, II, III, IV and V, respectively, ranging from a single module system to more complex systems. Thus, I illustrates a system merely consisting of a single module 59 according to the invention connected via a LAN cable with a PC 58. II illustrates a data acquisition system comprising three modules 59 according to the invention connected with a PC 58 via a PoE Ethernet switch 63. III illustrates a data acquisition system in which a number of modules according to the invention have been accommodated in a frame structure 60 according to the invention provided with output means enabling communication with a PC 58 via a LAN cable. IV illustrates the application of more than one frame structure 60 according to the invention with modules according to the invention, where synchronisation can be provided between the individual frames and where the data output from each of the frames are coupled to a PC 58 via a PoE Ethernet switch 63. Finally, V illustrates application of a frame structure 60 according to the invention accommodating modules according to the invention in combination with other data acquisition equipment 61, 62 such as the Bruel & Kjmr Intelligent Data Acquisition (IDA) equipment. It is understood that the examples shown in FIG. 8 are only illustrative and non-limiting. Other combinations of stand-alone modules 59 and frames 60 could also be envisaged without departing from the scope of the invention. Thus, for instance a combination of II and IV from FIG. 8, i.e. a system comprising a number of separate modules according to the invention (not necessarily three as shown in II) and a number of frames according to the invention (not necessarily two as shown in IV) could be used, the individual modules 59 and frames 60 being connected with the PoE Ethernet switch 63.

Figure 9:
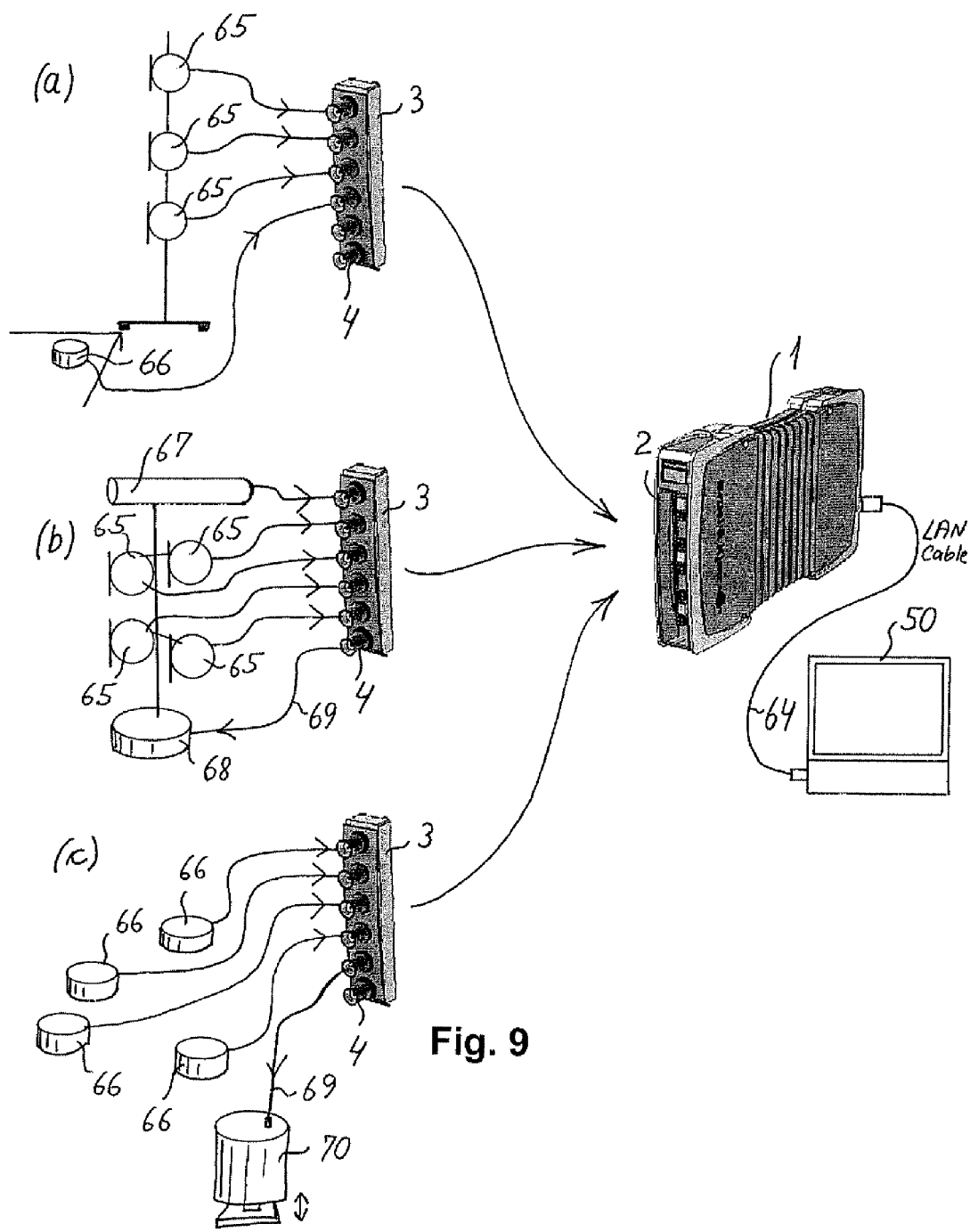
FIG. 9 illustrates an important consequence of applying the modules with detachable front units according to the invention.

FIGS. 9 (*a*), (*b*) and (*c*) illustrate an important consequence of applying the modules with detachable front units according to the invention. In an industrial plant, data acquisition using several different transducer types and configurations may be required. Thus, FIG. 9(*a*) illustrates schematically a transducer configuration comprising three microphones 65 mounted in an array and an additional accelerometer 66. These transducers 65, 66 are connected to respective connectors 4 on a detachable front unit 3 according to the invention. When data acquisition using this transducer configuration shall take place, the front unit 3 is attached to the module 1 that in turn is connected to a PC 50 via a LAN cable 64. FIG. 9(*b*) illustrates a different transducer configuration for use in another case in the same industrial plant. The transducers comprise a directional microphone 67 and four omni-directional microphones 65 mounted in an array. These transducers are connected to a front unit 3 according to the invention and provide signals to the data acquisition module when the front unit 3 is attached to the module 1. One of the connectors 4 in the front unit 3 serves in this case as an output connector for providing a control signal to a turntable 68 used to rotate the microphones 65, 67 under control of the module 1 and/or of the attached PC 50. Finally, FIG. 9(*c*) illustrates a transducer configuration comprising four accelerometers 66 attached to input connectors in the front unit 3. An output connector in the front unit 3 provides a signal used to drive a vibrator 70 used to excite a structure during a measurement sequence. According to the invention, the front unit 3 comprises information about the particular configuration of the connectors 4, which information upon attachment of the front unit to the module is communicated to the module. According to the invention, each type of front units or panels has a unique ID known by the module. The module knows how to support each front unit or panel. Illegal combinations will be reported to the user. Hence, this information need not be provided to the data acquisition system by the operator. Furthermore, each transducer configuration can permanently be connected to a front unit (or more front units, if required), hence obviating the risk of errors when connecting transducers or other equipment to the individual connectors 4 of the front unit. Dedicated front units corresponding to specific configurations of transducers and/or control signals can be provided according to the invention.

In the following, a more detailed description of the main functional elements of the module and frame structure according to the invention is given.

Figure 10:
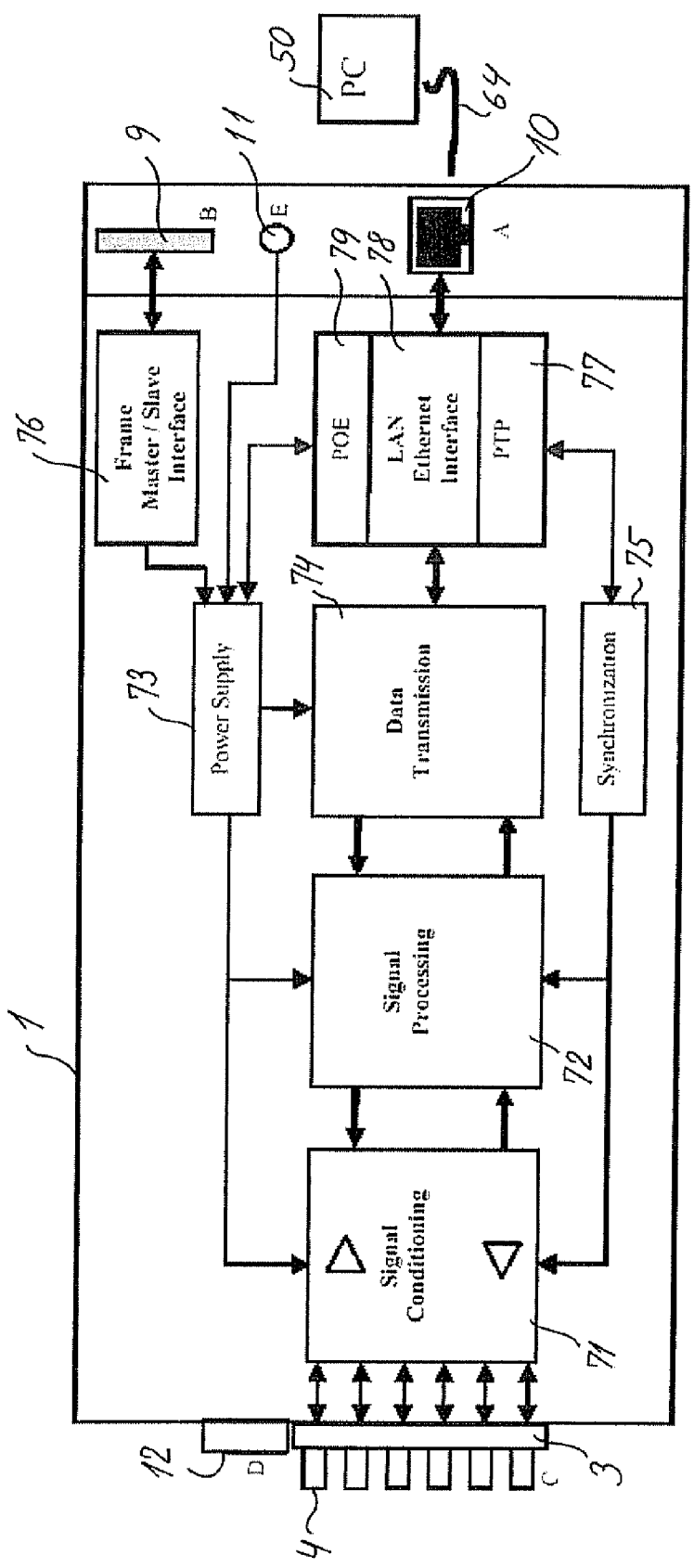
FIG. 10 shows a schematic block diagram of an embodiment of a module according to the invention.

Referring to FIG. 10 there is shown a schematic block diagram of an embodiment of a module 1 according to the invention. The module comprises a LAN Ethernet Interface 10, 77, 78, 79 supporting PoE, IEEE 802.af (Power over Ethernet) and PTP (Precision Time Protocol IEEE-1588). For communication with various functional units contained in the frame that can be shared by a number of modules mounted in the frame there is furthermore provided a frame support interface 9, 76. As an option, a connector for external DC input (power supply) 11 can also be provided in the module. The connectors designated by 9, 10 and 11 are provided in the rear face of the connector module, as shown schematically in FIG. 1. On the front face of the module there is provided a display and LEDs 12 for status information. In the recessed region (reference numeral 2 in FIG. 1) there can be attached the front unit 3 with the plurality of connectors 4 used for data acquisition and/or output control.

The main function of the module according to the invention is to transform electrical signals from the front unit connectors 4 to a digital data-stream and send these data to a controller/PC 50 via the LAN Ethernet interface 10. However, the module can also receive digital information from the controller/PC 50 via the Ethernet interface 10 and convert this to electrical signals on the connectors 4. The module can be powered using the external DC input connector 11 or from the Ethernet interface 10 if Power over Ethernet (PoE) is applied. If the module is placed in a frame, the module will preferably receive power through the frame support connector 9.

The module according to the embodiment shown in FIG. 10 comprises the further main functional elements: a signal conditioning amplifier unit 71, signal processing means 72, a power supply 73, a data transmission unit 74 and a synchronisation unit 75.

Figure 11:
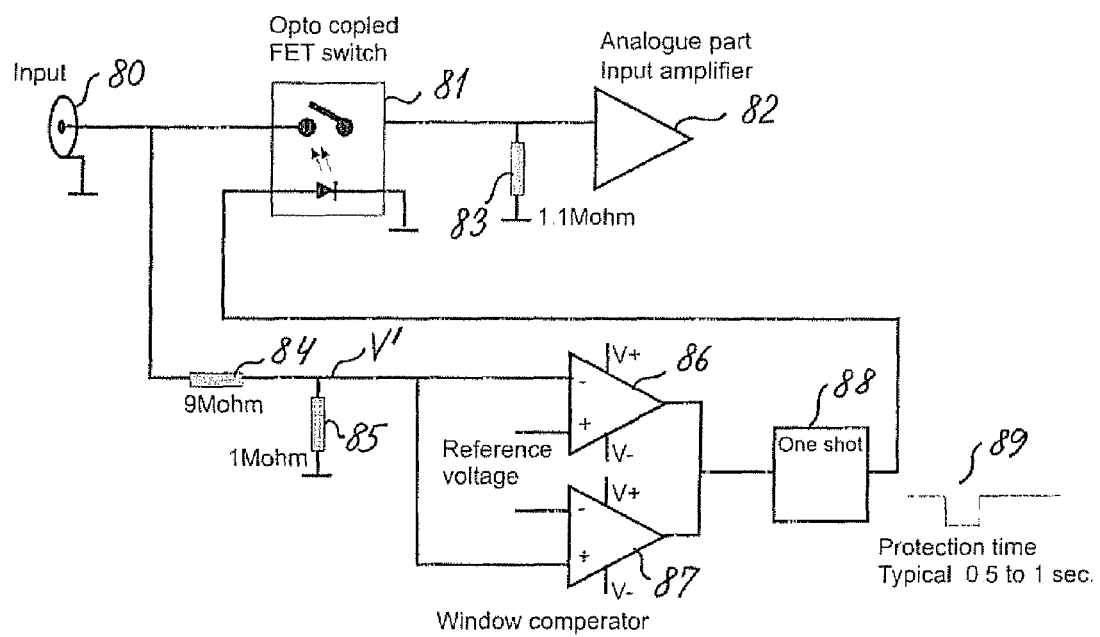
FIG. 11 shows an embodiment of an input protection system.

The module according to the invention can be provided with an input protection system (for instance inside block 71), an embodiment of which is shown in FIG. 11. Traditionally analogue circuits are protected by connecting one or two diodes to the input of the circuit, whereby excess voltage is coupled either to the positive or to the negative supply voltage. However, this as such very simple protection means suffers from disadvantages. Thus, if the input voltage exceeds the level where the diodes become conductive, the input impedance will be reduced drastically. This can prove detrimental in many practical measuring situations.

According to an embodiment of the present invention, analogue circuits are protected by a method that does not lead to a reduction of the input impedance, even though the input voltage by far exceeds the supply voltage. The input impedance remains high.

The protection is according to the invention attained by effectively very rapidly disconnecting the entire analogue circuit from the input connector. The disconnection is effected by means of a FET switch and must be effected so rapidly that the amount of energy input in the analogue circuit is so limited that it does not cause any damage. The method of protection according to the invention is illustrated by means of the circuit shown in FIG. 11. Connected to the input 80 there is provided a very high impedance voltage dividing network 84, 85, in parallel with the analogue input itself. The impedance is very high, typically on the order of 10 Mohm. The current drawn by the voltage dividing circuit consisting of the resistors 84, 85 is hence negligible. The reduced voltage V' provided by the voltage dividing network is used as input to a comparator comprising the two operational amplifiers 86 and 87. The output signal from the comparator controls a one-shot multivibrator 88, which in turn controls a FET switch 81 coupled to the input 80. When the input voltage rises above a preset threshold value—i.e. above the maximum allowable voltage level—the comparator is triggered and the one-shot circuit 88 and the FET switch disconnect immediately and effectively the current to the analogue circuit 82.

After a suitable time interval, for instance 0.5 or 1 second, the one-shot circuit 88 releases the FET switch. If the voltage on the input 80 has returned to within normal, allowable limits, the analogue circuit 82 can resume its normal function. If the voltage on the input 80 is still above the allowable level, the protection circuit is again triggered and the analogue circuit 82 is again disconnected from the input 80, whereby an effective protection of the analogue circuit 82 is attained. This procedure will continue until no excessive voltage is present in the input terminal 80.

Figure 12:
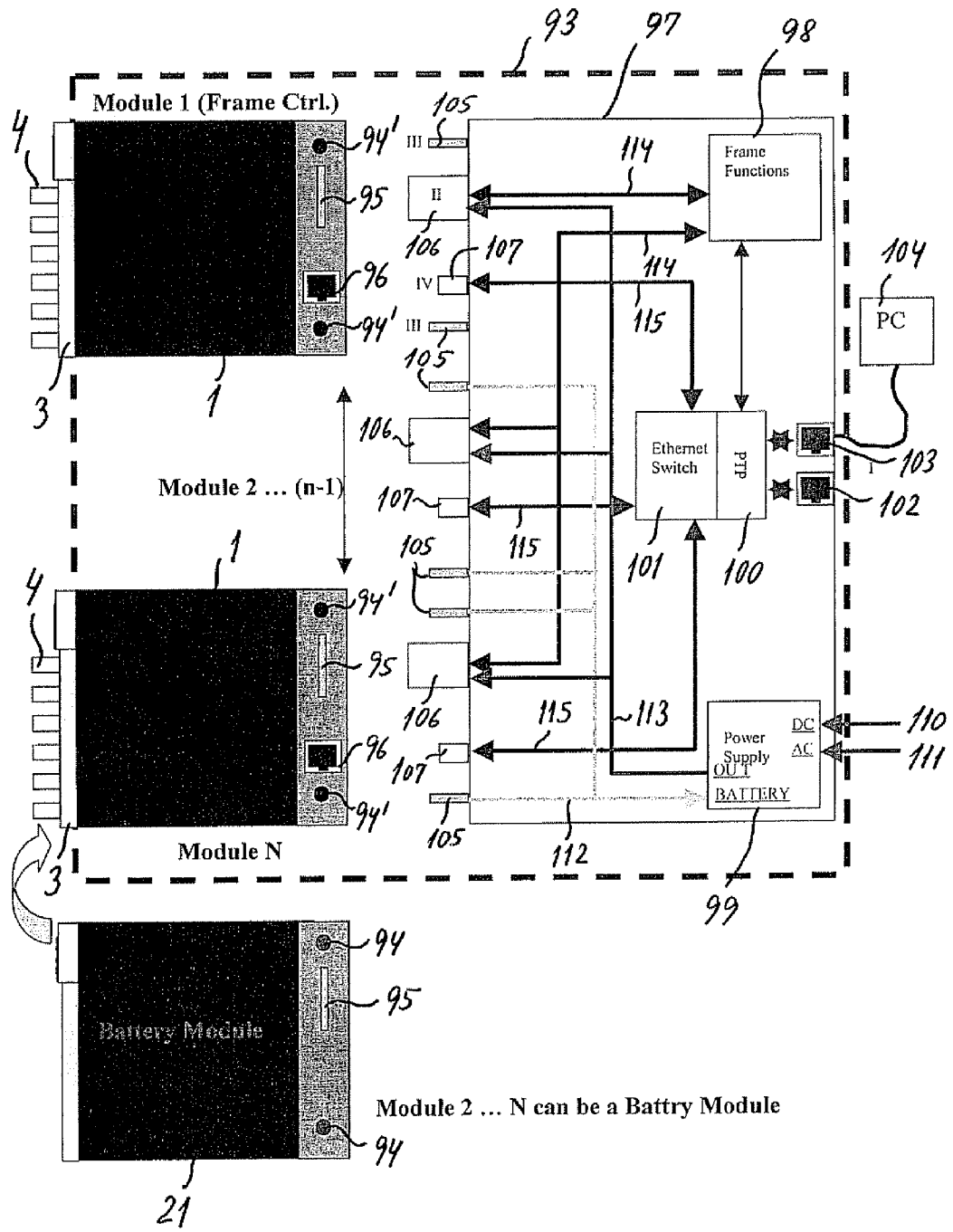
FIG. 12 shows a schematic diagram of a frame structure according to the invention for accommodating a number of modules according to the invention.

FIG. 12 shows a schematic diagram of a frame structure according to the invention for accommodating a number of modules according to the invention. As illustrated in FIG. 3, a typical frame structure according to the invention can accommodate up to 11 modules, but this is only to be regarded as a typical example.

The modules according to the invention can be controlled in a cluster of modules using the frame structure according to the invention. In FIG. 12, a number of modules 1 are shown together with an accommodating frame structure 93. Communication between the individual modules and the frame structure takes place via frame Ethernet male connectors 107 corresponding to the female LAN connectors 96 (or reference numeral 10 in FIGS. 1 and 10) provided on the rear face of the individual modules, when the modules are inserted in the frame structure. The frame Ethernet male connectors 107 are connected with the Ethernet switch 101 through LAN connections 115. The frame contains an Ethernet switch 101 to provide a collection of data from all modules to the PC or controller 104 through the frame Ethernet interface 103. Several frame structures according to the invention can be daisy-chained using the second Ethernet connector 102 on the frame. One or more battery modules 21 according to the invention (FIG. 4) can provide power to the frame using the frame power connectors 105 that cooperate with corresponding connectors 94 on the battery module(s). According to a specific embodiment, the battery modules 21 can reside in slot no. 2 to N of the frame structure. The power from a given battery module 21 is provided to the power supply 99 through the battery output connections 112, and power is provided from the power supply 99 to individual modules 1 through module power connections 113, i.e. via the frame/module interface connectors 106 described below. (It is noted that when the modules are used as stand-alone modules, they can also be powered through the LAN connection 96 using the PoE facility, but as the efficiency of a PoE supply is less than that of a normal DC input, it is advantageous that the modules 1 are powered from the power supply 99 through the frame/module interface connectors when the modules are accommodated in the frame structure and only powered through PoE when applied as stand-alone units). Alternatively, the frame can also be powered by an external AC or DC supply as indicated by reference numerals 110 and 111. The frame according to the shown embodiment comprises additional functional units, such as dedicated frame functions 98, the PTP (precision time protocol) means 100 and the power supply 99. The connector means 94 and 105 are also used as guide means to align the individual modules in their respective slots in the frame and when not used as power supply connectors, this guide function is their sole function, as for instance shown by reference numerals 94' and 105' in connection with Module 1 in FIG. 12.

According to preferred embodiments of the invention, any module can function as a frame controller. As shown in FIG. 12 module no. 1 functions as frame controller.

Most rack-based systems have a dedicated controller-module that controls shared resources—e.g. fans—and provides frame-centric services such as supplying an inventory on requests from e.g. a PC. The frame-controller of the present invention can be implemented as a software process that resides in all intelligent modules and is used whenever that module is inserted in a predefined slot in the frame. This means that the user does not "waste" a slot on something that does not provide any other functionality.

The frame structure according to the invention furthermore comprises frame/module interface connectors 106 for communication with corresponding connectors 95 (or reference numeral 9 in FIGS. 1 and 10) provided on the rear face of the individual modules. The frame/module interface connectors 106 are connected to the frame functions unit 98 through frame/module control connections 114. The frame/module interfaces 106-95 serve several purposes. For instance, the module in slot no. 1 can control several frame functions in the frame, and the frame can support several module functions in all slots through this connector. This is set forth in TABLE 1:

TABLE 1

| Slot#1 Functionality (Frame Controller only) | Slot#1 → Slot#N Functionality | Comments |
|---|---|---|
| | Power Supply | Only power-input when in frame. |
| | Debug interfaces | Used during development |
| | Power Off | Turn off module in frame when not used |

TABLE 1-continued

| Slot#1 Functionality (Frame Controller only) | Slot#1 → Slot#N Functionality | Comments |
| --- | --- | --- |
| Synchronisation Master | Synchronization Slave (Slot#2 → Slot#N) | All modules in the frames use the same sync. signals. |
| | Module Type Identification | The frame need to know if the module in a slot is: Empty Acquisition Module Battery Module Other type |
| | Frame Indication | The module can see if it is mounted in a frame |
| | Inter-module communication | Used for simple communication between modules and frame. The module can get information about its slot-position through this interface. |
| Frame Fan-control/ Temperature reading. Monitoring of Battery Module charging Configuration of Frame Firmware Implement Frame Homepage and display Frame configuration (modules in slots/empty slots/modules without front units) | | |

Figure 13:
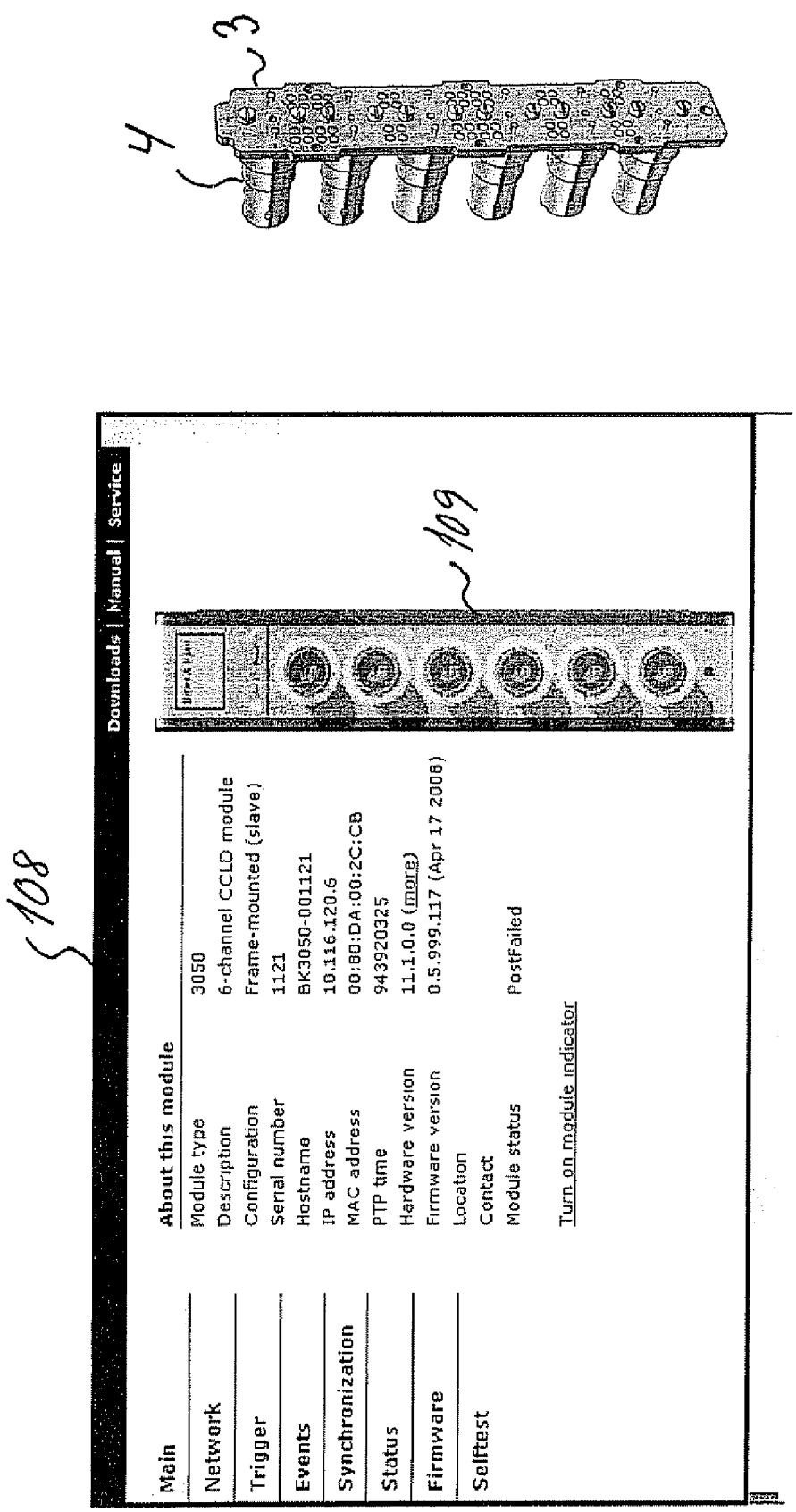
FIG. 13 shows an example of an Internet home page describing details of the modules according to the invention and the connector configuration on the detachable front units.

According to the invention, the modules can comprise a feature termed "Embedded Graphics for automatic configuration updates". Thus, each detachable front unit 3 contains according to a preferred embodiment of the invention a memory-chip containing the image of the physical front unit part. This makes it possible for a module hosting the detachable unit to display the total module configuration over the Internet using a dedicated Module Homepage. Attaching a new detachable front unit to a module will automatically update the Module Homepage with the new image—even if the module software is not supporting the front-panel functionality. Referring to FIG. 13, the image 109 on the Module Homepage 108 is residing in a PROM on the front unit 3. This functionality enables the quick information on new configurations of front units that are available to users as well as any details and changes of functionalities of the modules according to the invention.

The invention claimed is:

1. A module for data acquisition, the module comprising:
a main body having a front portion; and
a detachable front unit configured to releasably attach to said front portion, the detachable front unit comprising one or more first electrical connectors for communicating with external input units via data or signals and a first set of electrical terminals;
wherein the main body includes a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more first electrical connectors of the front unit;
whereby the main body is configured to process data or signals received by said one or more first electrical connectors from said external input units and output the data or signals or processed versions of the data or signals to one or more external systems via said data output connector, and
wherein said detachable front unit includes a memory unit storing information about a configuration of the one or more first electrical connectors.

2. A module according to claim 1, where said data output connector means is a LAN female connector, wherein the external input units include at least one of a microphone and an accelerometer, and wherein the one or more external systems include at least one of a personal computer, a second module, and a frame structure that includes a plurality of second modules.

3. A module according to claim 1, further comprising a frame master/slave interface.

4. A module according to claim 1, further comprising a set of visual indicators indicating a type of connector means for each of the first electrical connectors and the data output connector as an input connector or an output connector, and indicating an error state of each of the first electrical connectors and the data output connector.

5. A module according to claim 1, further comprising an input protector for disconnecting the electrical connection established between the second set of electrical terminals and any of the one or more first electrical connectors of the front unit when a voltage on an input from the first electrical connector exceeds a given threshold level, said input protector comprising a FET switch in an input path to an analogue part, wherein the FET switch is controlled by a combination of a comparator and a one-shot multivibrator, wherein the one-shot multivibrator is configured to effect disconnection of the FET switch when the voltage on the input from the first electrical connector to the comparator exceeds the given threshold level, and wherein the voltage on the input from the first electrical connector to the comparator is obtained from a voltage on the input from the first electrical connector through a voltage dividing network having an impedance that is substantially larger than an input impedance of said analogue part.

6. A module according to claim 1, wherein the data output connector of the main body of each module is connected via a LAN cable to at least one of a personal computer, an external data storage device, and external data processing equipment.

7. A module for data acquisition, the module comprising:
a main body having a front portion; and
a detachable front unit configured to releasably attach to said front portion, the detachable front unit comprising one or more first electrical connectors for communicating with external input units via data or signals and a first set of electrical terminals;
wherein the main body includes a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more first electrical connectors of the front unit;
whereby the main body is configured to process data or signals received by said one or more first electrical connectors from said external input units and output the data or signals or processed versions of the data or signals to one or more external systems via said data output connector, and
where said memory unit stores an image representation of a physical front face of the detachable front unit and module configuration information.

8. A module according to claim 7, wherein the module is configured to upload the image representation to a remote system configured to update to a module homepage maintained for the module that can be accessed via the Internet, and wherein the module, upon the detachable front unit being released from the front portion and a new detachable front unit being releasably attached to the front portion of the module, will automatically upload a new image representation of a physical front face of the new detachable front unit and an updated configuration of the module to the remote system for updating said module homepage.

9. A frame structure, comprising:
a plurality of modules;
a plurality of slots each configured to releasable receive a corresponding module of the plurality of modules inserted therein, and
a first Ethernet interface configured to receive data collected by each of the modules received within the plurality of slots from an output LAN connector of the module and output the received data to an externally connected personal computer or a controller,
wherein each of the plurality of modules includes:
a main body having a front portion; and
a detachable front unit configured to releasably attach to said front portion, the detachable front unit comprising one or more first electrical connectors for communicating with external input units via data or signals and a first set of electrical terminals, the main body including a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more first electrical connectors of the front unit,
wherein the main body of each module is configured to process data or signals received by the one or more first electrical connectors of the front unit of the module from the said external input units and output the data or signals or processed versions of the received data or signals to one or more external systems via said data output connector of the main body, and
wherein each of the slots of said frame structure includes Ethernet male connectors configured to provide for communication with a corresponding female LAN connector of the corresponding module received therein, and
wherein said detachable front unit of each module includes a memo unit storing information about a configuration of the one or more first electrical connectors.

10. A frame structure according to claim 9, wherein at least some of said slots are configured to receive a corresponding battery module of the plurality of modules inserted therein, and wherein the frame structure is configured to provide power from each of the battery modules inserted within a slot of the plurality of slots to other modules of the plurality of modules that are inserted within the plurality of slots through a connection to a power supply in said frame structure.

11. A frame structure according to claim 9, wherein the Ethernet interface is connected via a LAN cable to at least one of a personal computer, an external data storage device, and external data processing equipment.

12. A frame structure, comprising:
a plurality of modules;
a plurality of slots each configured to releasable receive a corresponding module of the plurality of modules inserted therein;
a frame functions unit and frame/module interface connectors for communication with corresponding connectors provided in each of the modules inserted within a slot of the plurality of slots, the frame/module interface connectors being connected to the frame functions unit through frame/module control connections; and
a first Ethernet interface configured to receive data collected by each of the modules received within the plurality of slots from an output LAN connector of the module and output the received data to an externally connected personal computer or a controller,
wherein each of the plurality of modules includes:
a main body having a front portion; and
a detachable front unit configured to releasably attach to said front portion, the detachable front unit comprising one or more first electrical connectors for communicating with external input units via data or signals and a first set of electrical terminals, the main body including a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more first electrical connectors of the front unit,
wherein the main body of each module is configured to process data or signals received by the one or more first electrical connectors of the front unit of the module from the said external input units and output the data or signals or processed versions of the received data or signals to one or more external systems via said data output connector of the main body, and wherein each of the slots of said frame structure includes Ethernet male connectors configured to provide for communication with a corresponding female LAN connector of the corresponding module received therein.

13. A frame structure, comprising:

a plurality of modules;

a plurality of slots each configured to releasable receive a corresponding module of the plurality of modules inserted therein;

a first Ethernet interface configured to receive data collected by each of the modules received within the plurality of slots from an output LAN connector of the module and output the received data to an externally connected personal computer or a controller; and a second Ethernet interface configured to enable the frame structure to be daisy-chained with a plurality of other frame structures, and wherein each of the plurality of modules includes:

a main body having a front portion; and a detachable front unit configured to releasably attach to said front portion, the detachable front unit comprising one or more first electrical connectors for communicating with external input units via data or signals and a first set of electrical terminals, the main body including a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more first electrical connectors of the front unit, wherein the main body of each module is configured to process data or signals received by the one or more first electrical connectors of the front unit of the module from the said external input units and output the data or signals or processed versions of the received data or signals to one or more external systems via said data output connector of the main body, and wherein each of the slots of said frame structure includes Ethernet male connectors configured to provide for communication with a corresponding female LAN connector of the corresponding module received therein.

14. A system for data acquisition, comprising:

an Ethernet switch; and a plurality of modules that each include:

a main body having a front portion; and a detachable front unit configured to releasably attach to said front portion, the detachable front unit comprising one or more first electrical connectors for communicating with external input units via data or signals and a first set of electrical terminals, the main body including a second set of electrical terminals provided externally on the front portion and a data output connector, the electrical terminals of the second set of electrical terminals being configured to establish an electrical connection with corresponding electrical terminals of the first set of electrical terminals of said front unit when said front unit is attached to said front portion to thereby establish an electrical connection with the one or more electrical connectors of the front unit, wherein each of the modules is configured to process data or signals received by the one or more first electrical connectors of the connector from the external input units and output the data or signals or processed versions of the data or signals to one or more external systems via said data output connector of the module, and wherein the data output connector of each of the modules is connected through a first LAN cable to the Ethernet switch that in turn is connected through a second LAN cable to at least one of a personal computer, an external data storage device, and external data processing equipment.

* * * * *

UNITED STATES PATENT AND TRADEMARK OFFICE
CERTIFICATE OF CORRECTION

| | | |
|---|---|---|
| PATENT NO. | : 8,345,428 B2 | Page 1 of 1 |
| APPLICATION NO. | : 12/119690 | |
| DATED | : January 1, 2013 | |
| INVENTOR(S) | : Nielsen et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 912 days.

Signed and Sealed this
Eleventh Day of November, 2014

Michelle K. Lee
*Deputy Director of the United States Patent and Trademark Office*